United States Patent
Kobayashi

(10) Patent No.: US 8,102,208 B2
(45) Date of Patent: Jan. 24, 2012

(54) SIGNAL AMPLIFIER

(75) Inventor: Hiroyuki Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/769,773

(22) Filed: Apr. 29, 2010

(65) Prior Publication Data

US 2010/0327975 A1 Dec. 30, 2010

(30) Foreign Application Priority Data

Jun. 30, 2009 (JP) ................. 2009-156193

(51) Int. Cl.
*H03F 3/45* (2006.01)
*H03G 3/20* (2006.01)

(52) U.S. Cl. ........................ 330/254; 330/129

(58) Field of Classification Search ............ 330/129, 330/253, 254
See application file for complete search history.

(56) References Cited

U.S. PATENT DOCUMENTS

| 7,170,350 B2 * | 1/2007 | Ryynanen et al. ........... 330/254 |
| 2009/0085665 A1 | 4/2009 | Kousai | |

FOREIGN PATENT DOCUMENTS

| JP | 2004503163 | 1/2004 |
| JP | 2007116651 | 5/2007 |
| JP | 2008252182 | 10/2008 |
| JP | 2009089225 | 4/2009 |

OTHER PUBLICATIONS

Staszewski, et al.; All-Digital PLL and Transmitter for Mobile Phones, IEEE Journal of Solid-State Circuits, vol. 40, No. 12, Dec. 2005, pp. 2469-2482.

* cited by examiner

*Primary Examiner* — Robert Pascal
*Assistant Examiner* — Khiem Nguyen
(74) *Attorney, Agent, or Firm* — Turocy & Watson, LLP

(57) ABSTRACT

A signal amplifier controls an output amplitude of a differential transmitted from an amplifier circuit to two output terminals via each of 2N number of MOS transistors that operate as a switch by switching a control value n, and includes an amplitude-control-word switching unit that multiplies the control value n by a value 1 or a value −1 and switches between an amplitude control word of a value (N+n) and an amplitude control word of a value (N−n) of a complementary 2N-bit amplitude control word.

14 Claims, 3 Drawing Sheets

SIGNAL AMPLIFIER

CROSS-REFERENCE TO RELATED APPLICATIONS

This application is based upon and claims the benefit of priority from the prior Japanese Patent Application No. 2009-156193, filed on Jun. 30, 2009; the entire contents of which are incorporated herein by reference.

BACKGROUND OF THE INVENTION

1. Field of the Invention

The present invention relates to a signal amplifier.

2. Description of the Related Art

A so-called Digitally Controlled Power Amplifier (DPA) capable of controlling an amplified amplitude by discrete values is known as a signal amplifier that is used for amplifying an amplitude modulation component (a change component of an envelope) of a radio-frequency signal (hereinafter, RF signal) that is subjected to modulation including an amplitude modulation. For example, JP-A. 2009-89225 (KOKAI) proposes the DPA having a differential output configuration as one of various DPAs, which is capable of performing amplification with high linearity with respect to a wide range of a signal amplitude level.

The DPA proposed in JP-A. 2009-89225 (KOKAI) operates while maintaining the number of MOS transistors in an ON operation state and the number of MOS transistors in an OFF operation state of each of a plurality of MOS transistors on an in-phase side and a reversed phase side that are controlled to be in the ON operation state and the OFF operation state by a control signal based on a complementary Amplitude Control Word (ACW), in a predetermined relationship.

However, there is an unavoidable problem in the MOS transistor that the operation characteristics degrade due to aging. Therefore, when the conventional DPA proposed in JP-A. 2009-89225 (KOKAI) is kept operating in the above operation state, the above described predetermined relationship is disrupted due to the aging of the MOS transistor, so that symmetry between output signals on the normal phase side and the reversed phase side is disrupted. For example, even if a differential output is controlled at zero level by the ACW, an output level does not become the zero level and has a value. In other words, with the above described conventional DPA, the linearity of an output amplitude with respect to the ACW is disrupted due to the aging, so that a correct output cannot be obtained.

SUMMARY OF THE INVENTION

According to one aspect of the present invention, a signal amplifier includes an amplitude-control-word generator that generates a 2N-bit amplitude control word; and a signal amplifying unit that comprises 2N number of first switch circuits and 2N number of second switch circuits that are turned on and off based on the amplitude control word, and 2N number of first amplifier circuits and 2N number of second amplifier circuits that correspond to the 2N number of the first switch circuits and the 2N number of the second switch circuits, respectively and amplify input complementary radio-frequency signal, and outputs complementary first and second output signals, wherein the signal amplifying unit causes each N number of the first and the second switch circuits to be always on and causes each n (n=0 to N) number of the first and the second switch circuits out of remaining each N number of the first and the second switch circuits to be on, based on the amplitude control word.

According to one aspect of the present invention, a signal amplifier includes an amplitude-control-word generator that generates a 2N-bit amplitude control word; and a signal amplifying unit that comprises 2N number of first switch circuits and 2N number of second switch circuits that are turned on and off based on the amplitude control word, and an amplifier circuit that is connected to each of the 2N number of the first switch circuits and the 2N number of the second switch circuits and amplifies input complementary radio-frequency signal, and outputs complementary first and second output signals, wherein the signal amplifying unit causes each N number of the first and the second switch circuits to be always on and causes each n (n=0 to N) number of the first and the second switch circuits out of remaining each N number of the first and the second switch circuits to be on, based on the amplitude control word.

According to one aspect of the present invention, a signal amplifier includes an amplitude-control-word generator that generates a 2N-bit amplitude control word; and a signal amplifying unit that comprises 2N number of first switch circuits and 2N number of second switch circuits that are turned on and off based on the amplitude control word, and 2N number of first amplifier circuits and 2N number of second amplifier circuits that are connected to the 2N number of the first switch circuits and the 2N number of the second switch circuits and amplify input complementary radio-frequency signal, and outputs an output signal, wherein the signal amplifying unit causes each N number of the first and the second switch circuits to be always on and causes each n (n=0 to N) number of the first and the second switch circuits out of remaining each N number of the first and the second switch circuits to be on, based on the amplitude control word.

DETAILED DESCRIPTION OF THE INVENTION

A signal amplifier according to embodiments of the present invention is explained in detail below with reference to the accompanying drawings. The present invention is not limited to these embodiments.

Figure 1:
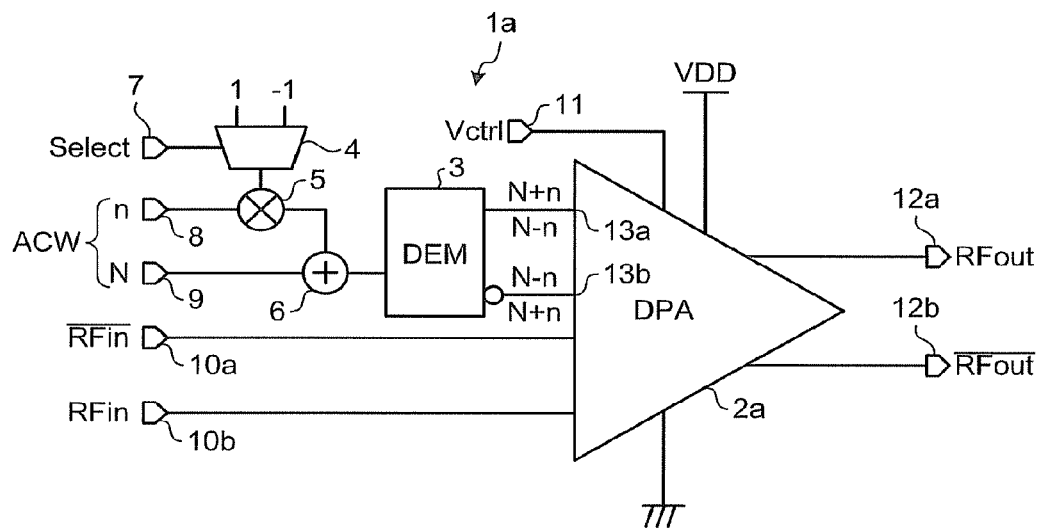
FIG. 1 is a block diagram illustrating a configuration of a signal amplifier according to a first embodiment of the present invention.
Figure 2:
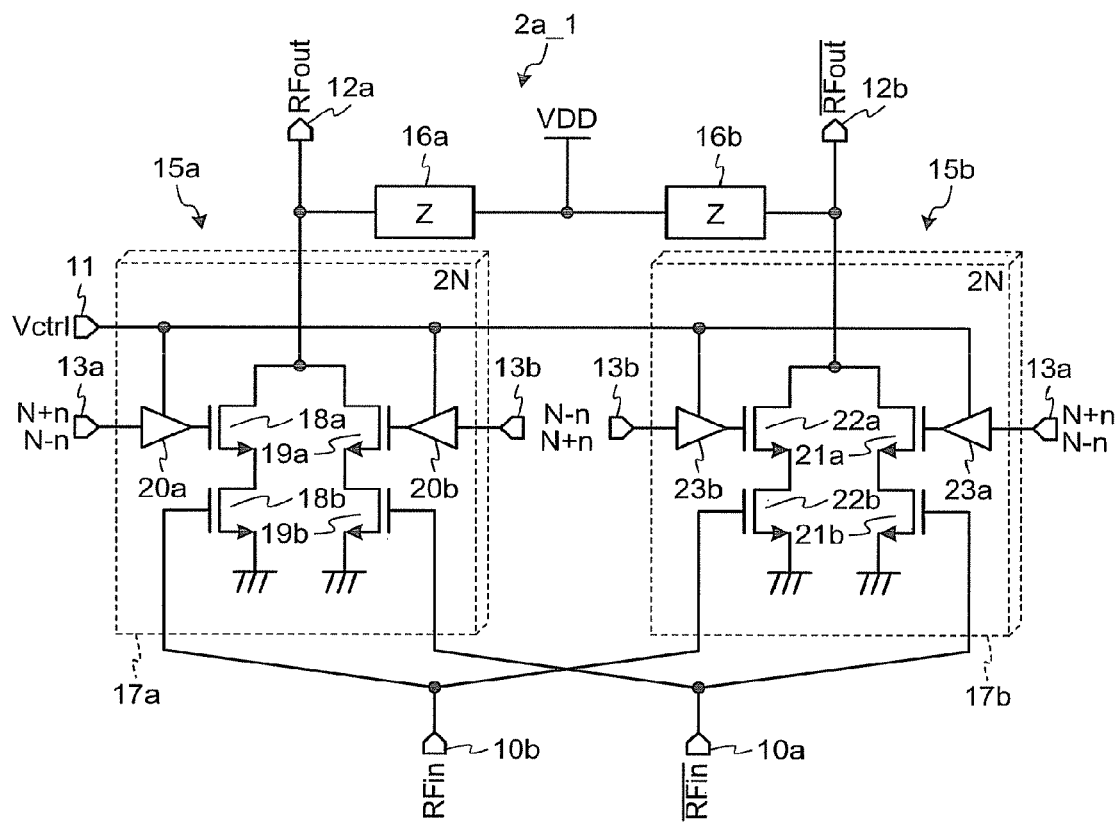
FIG. 2 is a circuit diagram illustrating a specific configuration example (first) of a DPA shown in FIG. 1.
Figure 3:
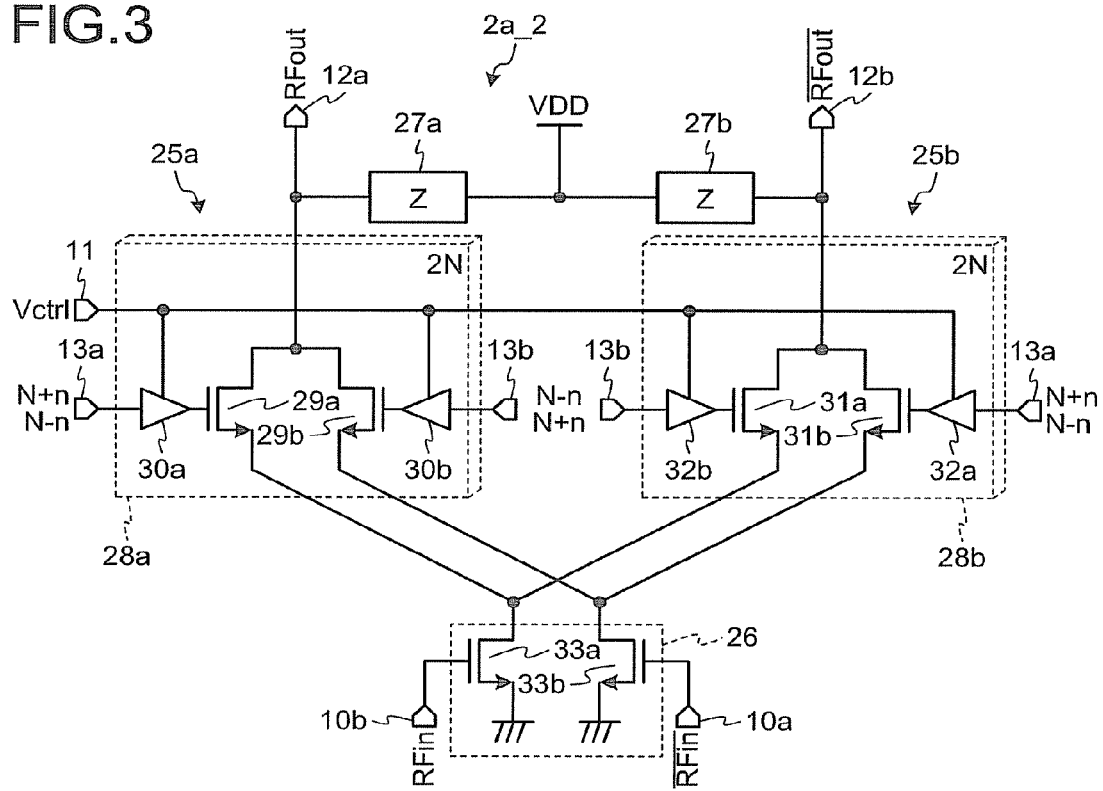
FIG. 3 is a circuit diagram illustrating a specific configuration example (second) of the DPA shown in FIG. 1.

A configuration and an operation of a signal amplifier according to a first embodiment of the present invention are explained with reference to FIG. 1 to FIG. 3. FIG. 1 is a block diagram illustrating a configuration of the signal amplifier according to the first embodiment of the present invention. FIG. 2 is a circuit diagram illustrating a specific configuration example 1 of a DPA shown in FIG. 1. FIG. 3 is a circuit diagram illustrating a specific configuration example 2 of the DPA shown in FIG. 1.

A signal amplifier 1a according to the first embodiment includes a DPA 2a, a matching circuit 3, a selection circuit 4, a multiplier 5, and an adder 6. Moreover, the signal amplifier 1a includes input terminals 7, 8, 9, 10a, 10b, and 11 and output terminals 12a and 12b as an external input-output terminal.

A DPA 2a_1 shown in FIG. 2 includes two single-phase amplifiers 15a and 15b. The output terminal 12a of the single-phase amplifier 15a and the output terminal 12b of the single-phase amplifier 15b are connected to an operation power supply VDD via a load resistance element 16a with an impedance Z and a load resistance element 16b with the impedance Z, respectively.

The two single-phase amplifiers 15a and 15b have the same configuration. The single-phase amplifier 15a includes 2N amplifier configuration circuits 17a arranged in parallel between the output terminal 12a and the ground, and the single-phase amplifier 15b includes 2N amplifier configuration circuits 17b arranged in parallel between the output terminal 12b and the ground.

The 2N amplifier configuration circuits 17a are each configured such that a series circuit of two cascode-connected MOS transistors 18a and 18b and a series circuit of two cascode-connected MOS transistors 19a and 19b are arranged in parallel between the output terminal 12a and the ground. The two MOS transistors 18a and 19a are configured such that the output terminal 12a is connected to the drain terminals and drive buffers 20a and 20b are arranged at the gate terminals. The 2N amplifier configuration circuits 17b are each configured such that a series circuit of two cascode-connected MOS transistors 21a and 21b and a series circuit of two cascode-connected MOS transistors 22a and 22b are arranged in parallel between the output terminal 12b and the ground. The two MOS transistors 21a and 22a are configured such that the output terminal 12b is connected to the drain terminals and drive buffers 23a and 23b are arranged at the gate terminals.

In each of the 2N amplifier configuration circuits 17a and 17b, the gate terminals of the MOS transistors 18b and 22b whose source terminals are connected to the ground are connected to the input terminal 10b and the gate terminals of the MOS transistors 19b and 21b are connected to the input terminal 10a. An RFin (input of an RF signal on a normal phase side) is applied to the input terminal 10b from outside, and a /RFin (input of the RF signal on a reversed phase side) is applied to the input terminal 10a from outside. In other words, the complementary RF signals are input to the amplifier configuration circuits 17a and 17b. The complementary RF signal is a signal of an amplitude modulation component (a change component of an envelope) in the RF signal. Therefore, output signals (RFout (output of the RF signal on the normal phase side) and /RFout (output of the RF signal on the reversed phase side)) transmitted from the output terminals 12a and 12b are an amplitude modulation signal.

Moreover, in each of the 2N amplifier configuration circuits 17a and 17b, each power supply terminal of the drive buffers 20a, 20b, 23a, and 23b is connected to the common input terminal 11. An arbitrary control voltage Vctrl is applied to the common input terminal 11 from outside. The input terminals of the 2N drive buffers 20a and 23a are connected to 2N control ports 13a on one-to-one basis, and the input terminals of the 2N drive buffers 20b and 23b are connected to 2N control ports 13b on one-to-one basis. A complementary 2N-bit amplitude control word (ACW) indicating values of sum and difference of a fixed value N and a control value n determined as follows is applied to the 2N control ports 13a and 13b from the matching circuit 3.

This complementary 2N-bit ACW is a control signal that individually turns on and off the MOS transistors 18a, 19a, 21a, and 22a. Specifically, when the bit value of the input ACW is "1", the drive buffers 20a, 20b, 23a, and 23b raise the potential of the gate terminals of the corresponding MOS transistors 18a, 19a, 21a, and 22a to the control voltage Vctrl. The corresponding MOS transistor is turned on. When the bit value of the input ACW is "0", the drive buffers 20a, 20b, 23a, and 23b lower the potential of the gate terminals of the corresponding MOS transistors 18a, 19a, 21a, and 22a to the ground potential. The corresponding MOS transistor is turned off.

At this time, in the single-phase amplifier 15a, each of the 2N MOS transistors 18a and 19a is controlled so that N MOS transistors are always on and remaining N MOS transistors are on or off by the 2N-bit ACW. In the single-phase amplifier 15b, each of the 2N MOS transistors 21a and 22a is controlled so that N MOS transistors are always on and remaining N MOS transistors are on or off by the 2N-bit ACW. In FIG. 1, the ACW applied from outside is divided into the control value n and the fixed value N to be individually applied to the input terminals 8 and 9. The fixed value N indicates the number of the MOS transistors that are controlled to be always on. On the other hand, the control value n indicates the number of the MOS transistors that are turned on out of the remaining N MOS transistors that are turned on or off, and takes a value n=0, 1, 2, ..., N. In the 2N-bit ACW input to the control ports 13a and 13b from the matching circuit 3, one ACW is a value (N+n) and the other ACW is a value (N−n).

A case is considered in which the 2N-bit ACW indicating the value (N+n) is applied to the 2N control ports 13a and the 2N-bit ACW indicating the value (N−n) is applied to the 2N control ports 13b from the matching circuit 3. In the 2N amplifier configuration circuits 17a, (N+n) MOS transistors out of the 2N MOS transistors 18a are turned on and (N−n) MOS transistors out of the 2N MOS transistors 19a are turned on. In the 2N amplifier configuration circuits 17b, (N+n) MOS transistors out of the 2N MOS transistors 21a are turned on and (N−n) MOS transistors out of the 2N MOS transistors 22a are turned on.

Consequently, in the 2N amplifier configuration circuits 17a, the amplification operation is performed by the (N+n) MOS transistors 18b to which a normal-phase-side RF signal is input and the (N−n) MOS transistors 19b to which a reversed-phase-side RF signal is input. When the control value n=0, the amplification amount on the normal phase side is equal to the amplification amount on the reversed phase side, so that the output terminal 12a is at zero level. When the control value n≧1, the amplification amount on the normal phase side becomes larger and thus a normal-phase-side amplified RF signal is output from the output terminal 12a.

In the 2N amplifier configuration circuits 17b, the amplification operation is performed by the (N−n) MOS transistors 22b to which the normal-phase-side RF signal is input and the (N+n) MOS transistors 21b to which the reversed-phase-side RF signal is input. When the control value n=0, the amplification amount on the normal phase side is equal to the amplification amount on the reversed phase side, so that the output terminal 12b is at zero level. When the control value n≧1, the amplification amount on the reversed phase side becomes larger and thus a reversed-phase-side amplified RF signal is output from the output terminal 12b. An amplified RF signal that indicates the amplitude change and is vertically symmetrical with respect to the zero level is obtained in the output terminals 12a and 12b. When the control value n=N, the maximum amplitude is obtained.

Next, a DPA 2a_2 shown in FIG. 3 includes two switch circuits 25a and 25b and one amplifier circuit 26 that is connected between the two switch circuits 25a and 25b and the ground. The output terminal 12a of the switch circuit 25a and the output terminal 12b of the switch circuit 25b are connected to the operation power supply VDD via a load resistance element 27a with the impedance Z and a load resistance element 27b with the impedance Z, respectively.

The two switch circuits 25a and 25b have the same configuration. The switch circuit 25a includes 2N switch configuration circuits 28a whose one ends are connected to the output terminal 12a in parallel. The switch circuit 25b includes 2N switch configuration circuits 28b whose one ends are connected to the output terminal 12b in parallel.

Each of the 2N switch configuration circuits 28a includes two MOS transistors 29a and 29b whose drain terminals are connected to the output terminal 12a and drive buffers 30a and 30b that are arranged at gate terminals of the two MOS transistors 29a and 29b. Each of the 2N switch configuration circuits 28b includes two MOS transistors 31a and 31b whose drain terminals are connected to the output terminal 12b and drive buffers 32a and 32b that are arranged at gate terminals of the two MOS transistors 31a and 31b.

In each of the 2N switch configuration circuits 28a and 28b, each power supply terminal of the drive buffers 30a, 30b, 32a, and 32b is connected to the common input terminal 11. The arbitrary control voltage Vctrl is applied to the common input terminal 11 from outside. The input terminals of the 2N drive buffers 30a and 32a are connected to the 2N control ports 13a on one-to-one basis, and the input terminals of the 2N drive buffers 30b and 32b are connected to the 2N control ports 13b on one-to-one basis. The complementary 2N-bit ACW indicating values of sum and difference of the fixed value N and the control value n is applied to the 2N control ports 13a and 13b from the matching circuit 3. The drive buffers 30a, 30b, 32a, and 32b perform an operation same as the drive buffers 20a, 20b, 23a, and 23b shown in FIG. 2.

The amplifier circuit 26 includes two MOS transistors 33a and 33b. Each source terminal of the MOS transistors 33a and 33b is connected to the ground. The MOS transistor 33a is such that the drain terminal is connected to each source terminal of the MOS transistors 29a and 31a and the gate terminal is connected to the input terminal 10b. The MOS transistor 33b is such that the drain terminal is connected to each source terminal of the MOS transistors 29b and 31b and the gate terminal is connected to the input terminal 10a. The RFin (input of the RF signal on the normal phase side) is applied to the input terminal 10b from outside, and the /RFin (input of the RF signal on the reversed phase side) is applied to the input terminal 10a from outside.

In this DPA 2a_2, the switch circuit 25a and the amplifier circuit 26 correspond to the single-phase amplifier 15a in the DPA 2a_1 and the switch circuit 25b and the amplifier circuit 26 correspond to the single-phase amplifier 15b in the DPA 2a_1, and the operation similar to the DPA 2a_1 is performed.

A case is considered in which the 2N-bit ACW indicating the value (N+n) is applied to the 2N control ports 13a and the 2N-bit ACW indicating the value (N−n) is applied to the 2N control ports 13b from the matching circuit 3. In the 2N switch configuration circuits 28a, (N+n) MOS transistors out of the 2N MOS transistors 29a operate and (N−n) MOS transistors out of the 2N MOS transistors 29b are turned on. In the 2N switch configuration circuits 28b, (N+n) MOS transistors out of the 2N MOS transistors 31b are turned on and (N−n) MOS transistors out of the 2N MOS transistors 31a are turned on.

Consequently, in the series circuit of the switch circuit 25a and the amplifier circuit 26, the amplification operation is performed by the MOS transistor 33a to which the normal-phase-side RF signal is input and the MOS transistor 33b to which the reversed-phase-side RF signal is input with the total drain currents of the (N+n) MOS transistors 29a and the (N−n) MOS transistors 29b as the drive currents, respectively. When the control value n=0, the amplification amount on the normal phase side is equal to the amplification amount on the reversed phase side, so that the output terminal 12a is at zero level. When the control value n≧1, the amplification amount on the normal phase side becomes larger and thus the normal-phase-side amplified RF signal is output from the output terminal 12a.

In the series circuit of the switch circuit 25b and the amplifier circuit 26, the amplification operation is performed by the MOS transistor 33a to which the normal-phase-side RF signal is input and the MOS transistor 33b to which the reversed-phase-side RF signal is input with the total drain currents of the (N−n) MOS transistors 31a and the (N+n) MOS transistors 31b as the drive currents, respectively. When the control value n=0, the amplification amount on the normal phase side is equal to the amplification amount on the reversed phase side, so that the output terminal 12a is at zero level. When the control value n≧1, the amplification amount on the reversed phase side becomes larger and thus the reversed-phase-side amplified RF signal is output from the output terminal 12b. The amplified RF signal that indicates the amplitude change and is vertically symmetrical with respect to the zero level is obtained in the output terminals 12a and 12b. In the similar manner to the DPA 2a_1, when the control value n=N, the maximum amplitude is obtained.

In this manner, in each of the single-phase amplifiers 15a and 15b of the DPA 2a_1 shown in FIG. 2, the amplification operation is performed individually on the normal phase side and the reversed phase side and the difference thereof is output. Moreover, in the DPA 2a_2 shown in FIG. 3, in each of the series circuit of the switch circuit 25a and the amplifier circuit 26 and the series circuit of the switch circuit 25b and the amplifier circuit 26, the amplification operation is performed individually on the normal phase side and the reversed phase side and the difference thereof is output in the similar manner.

In other words, in the DPA 2a_1 or the DPA 2a_2, (N+Nave) MOS transistors (Nave is an average output) are on on average out of the normal-phase-side MOS transistors and (N−Nave) MOS transistors are on on average out of the reversed-phase-side MOS transistors, so that the symmetry between the output signals on the normal phase side and the reversed phase side can be maintained, thus enabling to control the output amplitude with high linearity in accordance with the control value n of the ACW.

The matching circuit 3 shown in FIG. 1 is termed Dynamic Element Matching (DEM) and is provided to secure the symmetry. In other words, typically, when the input is the value (N+n), the matching circuit 3 generates a value in which a logical inverse operation is performed on the control value n of the input. Moreover, the matching circuit 3 outputs the 2N-bit ACW indicating the value (N+n) in which the logical inverse operation is not performed on the control value n to the control ports 13a and outputs the 2N-bit ACW indicating the value (N−n) in which the logical inverse operation is performed on the control value n to the control ports 13b. In the above operation process, the matching circuit 3 performs the operation for securing the symmetry. In the case of the DPA $2a\_1$, in order to average the variation between circuits on the normal phase side and the reversed phase side, the matching circuit 3 switches the bit array of the complementary 2N-bit ACW to switch the drive buffers that turn on the corresponding MOS transistors in the 2N drive buffers $20a$ and $23a$ to which the 2N-bit ACW indicating the value (N+n) is applied and switch the drive buffers that turn on the corresponding MOS transistors in the 2N drive buffers $20b$ and $23b$ to which the 2N-bit ACW indicating the value (N−n) is applied.

When two single-phase amplifiers are provided, the total number of the MOS transistors that are turned on can be made equal regardless of the magnitude of the signal amplitudes taken from two output terminals, so that the output resistance can be always kept constant. Consequently, the fluctuation in phase difference between input and output due to the change in the signal amplitude can be suppressed. Explanation is given for a case of providing two single-phase amplifiers; however, even in the case of providing one single-phase amplifier, it is possible to control the amplified amplitude of a single-ended output signal by switching the control value n in the similar manner.

As described above, with the operation in which the (N+Nave) MOS transistors are on on average out of the normal-phase-side MOS transistors and the (N−Nave) MOS transistors are on on average out of the reversed-phase-side MOS transistors, N or more MOS transistors are always in the ON state in one single-phase amplifier and N or more MOS transistors are always in the OFF state in the other single-phase amplifier. In this operation, if aging of the MOS transistor occurs, the symmetry between the output signals on the normal phase side and the reversed phase side is disrupted. For example, in the case where the control value n=0, two output signals are not canceled due to the disruption of the symmetry between the output signals, and the output level takes a value other than the zero level. In other words, in the operation in which the DPA $2a$ is operated by fixedly applying the 2N-bit ACW indicating the value (N+n) to the matching circuit 3, if the aging of the MOS transistor occurs, the linearity of the output amplitude with respect to the ACW is disrupted, so that the correct output cannot be obtained.

Therefore, in the present embodiment, in order to secure the symmetry between the output signals on the normal phase side and the reversed phase side even if the aging of the MOS transistor occurs, as shown in FIG. 1, an amplitude-control-word switching circuit (the selection circuit 4, the multiplier 5, and the adder 6) that switches the polarity of the control value n of the ACW to be applied to the matching circuit 3 is added. The 2N-bit ACW is divided into the fixed value N and the control value n to be individually input from the input terminals 8 and 9.

The operation of a portion related to the first embodiment is as follows. In FIG. 1, the selection circuit 4 selects one of the set values 1 and −1 in accordance with an instruction of a select signal (Select) applied to the input terminal 7 from outside. The select signal is a binary level signal and is applied to the input terminal 7 at arbitrary operation intervals. For example, when the select signal is a high level, the selection circuit 4 selects the value 1, and when the select signal is a low level, the selection circuit 4 selects the value −1.

The multiplier 5 multiplies the control value n of the 2N-bit ACW applied to the input terminal 8 from outside and the value selected by the selection circuit 4. The adder 6 adds the fixed value N of the 2N-bit ACW applied to the input terminal 9 from outside and the output of the multiplier 5.

The 2N-bit ACW indicating the value (N+n) or the value (N−n) is applied from the adder 6 to the matching circuit 3 in an arbitrary operation period.

When the output of the adder 6 is "N+n", the matching circuit 3 outputs the "N+n" to the control ports $13a$ of the DPA $2a$ and outputs "N−n" to the control ports $13b$ of the DPA $2a$. When the output of the adder 6 is "N−n", the matching circuit 3 outputs the "N−n" to the control ports $13a$ of the DPA $2a$ and outputs "N+n" to the control ports $13b$ of the DPA $2a$. In other words, in an arbitrary operation period, the complementary 2N-bit ACW is switched and applied from the matching circuit 3 to the 2N control ports $13a$ and $13b$ of the DPA $2a$.

Whereby, in the DPA $2a$, as shown in FIG. 2 and FIG. 3, because the number of the MOS transistors that are turned on on the in-phase side and the reversed phase side is switched every certain operation period, the average of the total number of the MOS transistors that are turned on on the in-phase side and the reversed phase side can be made even. In other words, a characteristic degradation (disruption of linearity) due to the aging can be prevented.

According to the first embodiment, in each of the two single-phase amplifiers included in the DPA, the phase of the control value of the ACW is appropriately inverted between the in-phase side and the reversed phase side, so that the degree of the degradation due to the aging can be made even between the in-phase side and the reversed phase side. Therefore, the linearity of the output amplitude with respect to the control value of the ACW can be maintained for a long period of time.

Figure 4:
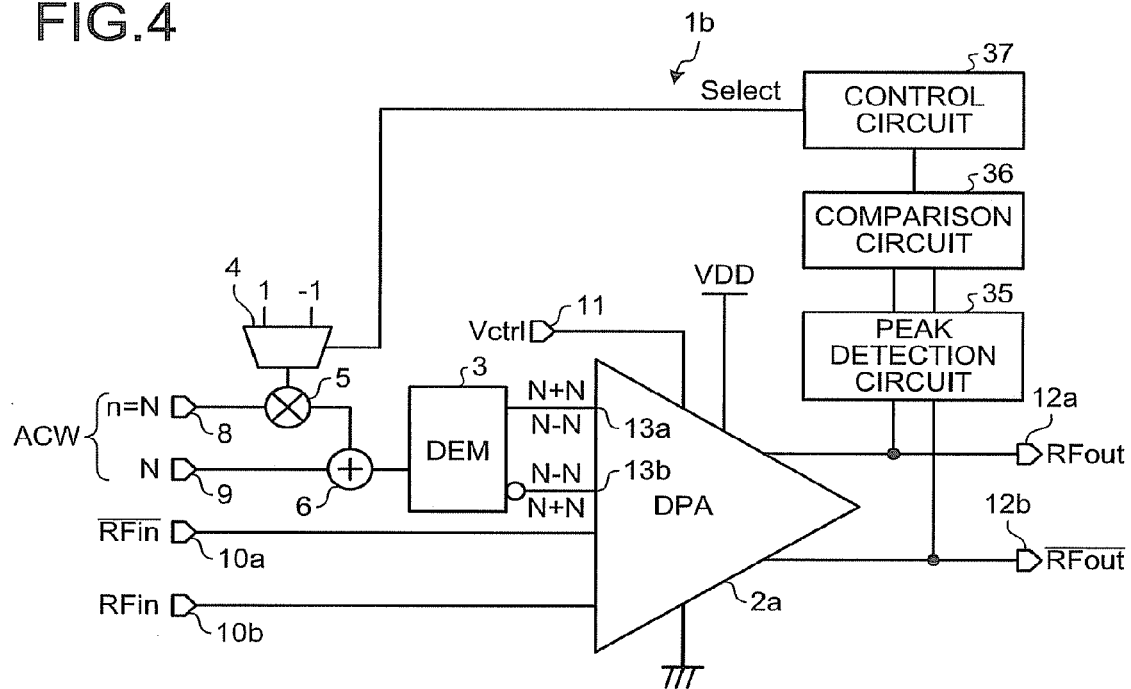
FIG. 4 is a block diagram illustrating a configuration of a signal amplifier according to a second embodiment of the present invention.

FIG. 4 is a block diagram illustrating a configuration of a signal amplifier according to a second embodiment of the present invention. In FIG. 4, components that are the same as or similar to those shown in FIG. 1 will be given the same reference numerals. The portion related to the second embodiment is mainly explained.

A signal amplifier $1b$ according to the second embodiment includes a peak detection circuit 35, a comparison circuit 36, and a control circuit 37 as units for generating the select signal to the selection circuit 4 compared with the configuration shown in FIG. 1.

In the second embodiment, in an operation start time, an idle period, or the like of a transmission device or the like that includes the signal amplifier $1b$, in the state where the control value n of the ACW is set to n=N to constantly output the maximum amplitude, a characteristic correction operation as follows is performed.

The peak detection circuit 35 detects the amplitude maximum value of a normal-phase-side output signal and the amplitude maximum value of a reversed-phase-side output signal. The comparison circuit 36 compares the magnitude relation between the normal-phase-side amplitude maximum value and the reversed-phase-side amplitude maximum value detected by the peak detection circuit 35. The control circuit 37 outputs the select signal that causes the selection circuit 4 to select the value 1 when the output amplitude on the normal phase side is larger and outputs the select signal that causes the selection circuit 4 to select the value −1 when the output amplitude on the reversed phase side is larger, in accordance with the comparison result in the comparison circuit 36.

The control circuit 37 determines a direction of the aging in the process of repeating the above operation, and outputs the select signal so that the directions of the aging in the two single-phase amplifiers $15a$ and $15b$ are opposite in the case of the DPA $2a\_1$ or outputs the select signal so that the directions of the aging in the two series circuits are opposite in the case of the DPA $2a\_2$. Therefore, a characteristic fluctuation due to the aging can be made even.

Thus, according to the second embodiment, the linearity of the output amplitude with respect to the ACW can be maintained for a long period of time in the similar manner to the first embodiment.

Figure 5:
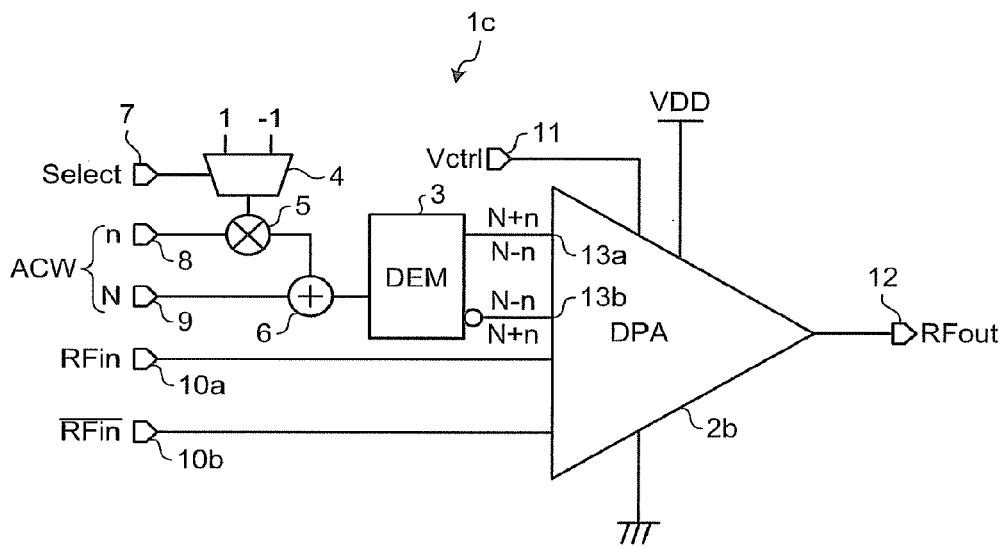
FIG. 5 is a block diagram illustrating a configuration of a signal amplifier according to a third embodiment of the present invention.

FIG. 5 is a block diagram illustrating a configuration of a signal amplifier according to a third embodiment of the present invention. In FIG. 5, components that are the same as or similar to those shown in FIG. 1 will be given the same reference numerals. The portion related to the third embodiment is mainly explained.

As shown in FIG. 5, a signal amplifier 1c according to the third embodiment includes a DPA 2b that includes one output terminal 12 instead of the DPA 2a compared with the configuration shown in FIG. 1.

The DPA 2b is configured to include one of the two single-phase amplifiers 15a and 15b shown in FIG. 2. Alternatively, the DPA 2b is configured to include one of the two series circuits shown in FIG. 3.

With this configuration, because the number of the MOS transistors that are turned on on the in-phase side and the reversed phase side is switched in the DPA 2b every certain operation period, the average of the total number of the MOS transistors that are turned on on the in-phase side and the reversed phase side can be made even. Therefore, the characteristic degradation (disruption of linearity) due to the aging can be prevented.

Thus, according to the third embodiment, in the similar manner to the first embodiment, the linearity of the output amplitude with respect to the ACW can be maintained for a long period of time.

Figure 6:
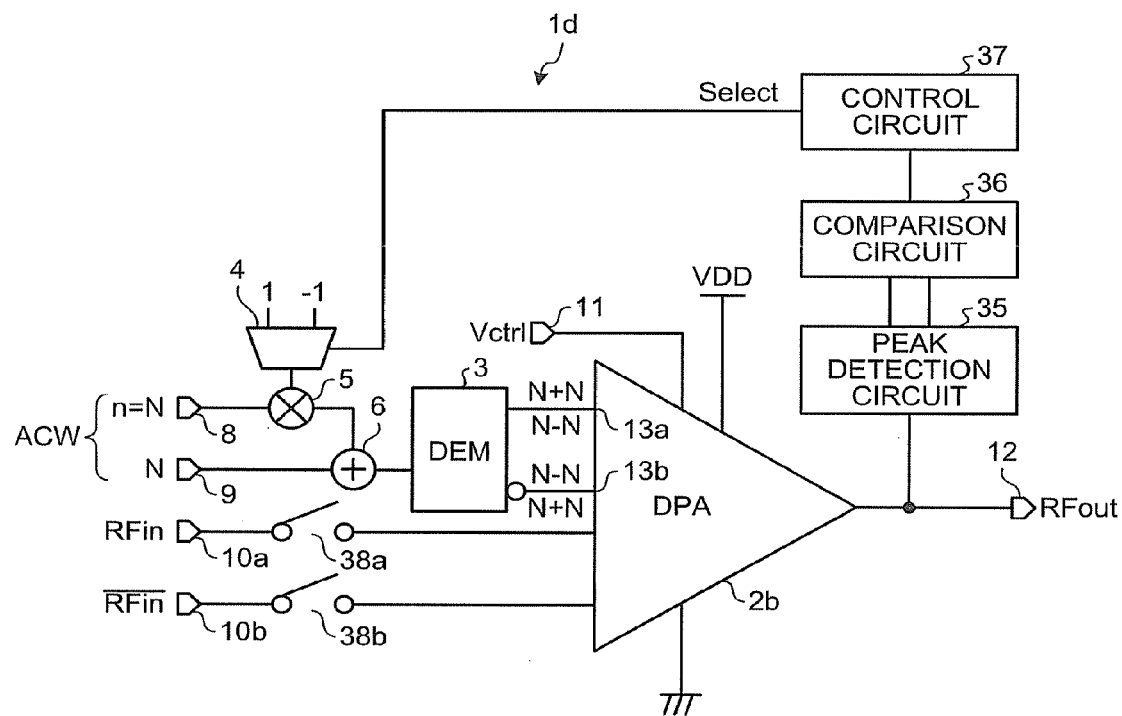
FIG. 6 is a block diagram illustrating a configuration of a signal amplifier according to a fourth embodiment of the present invention.

FIG. 6 is a block diagram illustrating a configuration of a signal amplifier according to a fourth embodiment of the present invention. In FIG. 6, components that are the same as or similar to those shown in FIG. 5 will be given the same reference numerals. The portion related to the fourth embodiment is mainly explained.

As shown in FIG. 6, a signal amplifier 1d according to the fourth embodiment includes the peak detection circuit 35, the comparison circuit 36, and the control circuit 37 as units for generating the select signal to the selection circuit 4 and open/close switches 38a and 38b in paths for introducing the complementary RF signals applied to the input terminals 10a and 10b to the DPA 2b, compared with the configuration shown in FIG. 5.

In the fourth embodiment, in an operation start time, an idle period, or the like of a transmission device or the like that includes the signal amplifier 1d, in the state where the control value n of the ACW is set to n=N to constantly output the maximum amplitude, the open/close switches 38a and 38b are alternately opened and closed. With this operation, an amplified output signal for the RF signal on the normal phase side and an amplified output signal for the RF signal on the reversed phase side are alternately output to the output terminal 12.

Whereby, the directions of the aging on the normal phase side and the reversed phase side can be controlled to be opposite by the peak detection circuit 35, the comparison circuit 36, and the control circuit 37 performing the characteristic correction operation same as that explained in the second embodiment, so that the characteristic fluctuation due to the aging can be made even.

Thus, according to the fourth embodiment, in the similar manner to the first embodiment, the linearity of the output amplitude with respect to the ACW can be maintained for a long period of time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal amplifier comprising:
an amplitude-control-word generator that generates a 2N-bit amplitude control word, N being an integer equal to or more than 1; and
a signal amplifying unit that comprises 2N number of first switch circuits and 2N number of second switch circuits that are turned on and off based on the amplitude control word, and 2N number of first amplifier circuits and 2N number of second amplifier circuits that correspond to the 2N number of the first switch circuits and the 2N number of the second switch circuits, respectively and amplify input complementary radio-frequency signal, and outputs complementary first and second output signals, wherein
the signal amplifying unit causes each N number of the first and the second switch circuits to be always on and causes each n (n=0 to N) number of the first and the second switch circuits out of remaining each N number of the first and the second switch circuits to be on, based on the amplitude control word,
wherein each of the 2N number of the first and the second switch circuits comprises a first MOS transistor and a second MOS transistor that are connected in parallel,
the first MOS transistor is turned on and off by the value (N+n) based on the amplitude control word,
the second MOS transistor is turned on and off by the value (N−n) based on the amplitude control word, and
the signal amplifying unit comprises a matching circuit that converts to the value (N+n) and the value (N−n) that are complementary based on the amplitude control word output from the amplitude-control-word generator.

2. The signal amplifier according to claim 1, wherein the first and the second switch circuits are turned on and off by a value (N+n) and a value (N−n) based on the 2N-bit amplitude control word.

3. The signal amplifier according to claim 1, wherein
each of the first and the second amplifier circuits comprises a third MOS transistor that is connected between one end of the first MOS transistor and a ground, and a fourth MOS transistor that is connected between one end of the second MOS transistor and a ground, and
the complementary radio-frequency signal is input to each gate terminal of the third and the fourth MOS transistor.

4. The signal amplifier according to claim 1, wherein
the amplitude-control-word generator comprises
a selector that selects one of set value 1 and value −1 based on a select signal,
a multiplier that multiplies a first input value n and an output of the selector, and
an adder that adds a second input value N and an output of the multiplier.

5. The signal amplifier according to claim 4, further comprising:
a peak detector that detects amplitude values of the first and the second output signals;
a comparator that compares detected amplitude values of the first and the second output signals; and a controller that generates the select signal based on a result of the comparison.

6. A signal amplifier comprising:
an amplitude-control-word generator that generates a 2N-bit amplitude control word, N being an integer equal to or more than 1; and
a signal amplifying unit that comprises 2N number of first switch circuits and 2N number of second switch circuits that are turned on and off based on the amplitude control word, and an amplifier circuit that is connected to each of the 2N number of the first switch circuits and the 2N number of the second switch circuits and amplifies input complementary radio-frequency signal, and outputs complementary first and second output signals, wherein
the signal amplifying unit causes each N number of the first and the second switch circuits to be always on and causes each n (n=O to N) number of the first and the second switch circuits out of remaining each N number of the first and the second switch circuits to be on, based on the amplitude control word,
wherein each of the 2N number of the first and the second switch circuits comprises a first MOS transistor and a second MOS transistor that are connected in parallel,
the first MOS transistor is turned on and off by the value (N+n) based on the amplitude control word,
the second MOS transistor is turned on and off by the value (N−n) based on the amplitude control word, and
the signal amplifying unit comprises a matching circuit that converts to the value (N+n) and the value (N−n) that are complementary based on the amplitude control word outputted from the amplitude-control-word generator.

7. The signal amplifier according to claim 6, wherein the first and the second switch circuits are turned on and off by a value (N+n) and a value (N−n) based on the 2N-bit amplitude control word.

8. The signal amplifier according to claim 6, wherein
the amplifier circuit comprises a third MOS transistor that is connected between one end of the first MOS transistor and a ground, and a fourth MOS transistor that is connected between one end of the second MOS transistor and a ground, and
the complementary radio-frequency signal is input to each gate terminal of the third and the fourth MOS transistor.

9. The signal amplifier according to claim 6, wherein
the amplitude-control-word generator comprises a selector that selects one of set value 1 and value −1 based on a select signal,
a multiplier that multiplies a first input value n and an output of the selector, and
an adder that adds a second input value N and an output of the multiplier.

10. The signal amplifier according to claim 9, further comprising:
a peak detector that detects amplitude values of the first and the second output signals;
a comparator that compares detected amplitude values of the first and the second output signals; and
a controller that generates the select signal based on a result of the comparison.

11. A signal amplifier comprising:
an amplitude-control-word generator that generates a 2N-bit amplitude control word, N being an integer equal to or more than 1; and
a signal amplifying unit that comprises 2N number of first switch circuits and 2N number of second switch circuits that are turned on and off based on the amplitude control word, and 2N number of first amplifier circuits and 2N number of second amplifier circuits that are connected to the 2N number of the first switch circuits and the 2N number of the second switch circuits and amplify input complementary radio-frequency signal, and outputs an output signal, wherein
the signal amplifying unit causes each N number of the first and the second switch circuits to be always on and causes each n (n=O to N) number of the first and the second switch circuits out of remaining each N number of the first and the second switch circuits to be on, based on the amplitude control word,
each of the 2N number of the first and the second switch circuits comprises a first MOS transistor and a second MOS transistor that are connected in parallel,
the first MOS transistor is turned on and off by the value (N+n) based on the amplitude control word,
the second MOS transistor is turned on and off by the value (N−n) based on the amplitude control word, and
the signal amplifying unit comprises a matching circuit that converts to the value (N+n) and the value (N−n) that are complementary based on the amplitude control word output from the amplitude-control-word generator.

12. The signal amplifier according to claim 11, wherein each of the first and the second amplifier circuits comprises a third MOS transistor that is connected between one end of the first MOS transistor and a ground, and a fourth MOS transistor that is connected between one end of the second MOS transistor and a ground, and
the complementary radio-frequency signal is input to each gate terminal of the third and the fourth MOS transistor.

13. The signal amplifier according to claim 11, wherein
the amplitude-control-word generator comprises
a selector that selects one of set value 1 and value −1 based on a select signal, a multiplier that multiplies a first input value n and an output of the selector, and an adder that adds a second input value N and an output of the multiplier.

14. The signal amplifier according to claim 13, further comprising:
two switches that are interposed in input paths of the complementary radio-frequency signal, respectively;
a peak detector that detects amplitude values on a normal phase side and a reversed phase side transmitted from an output terminal when the two switches are opened and closed alternately;
a comparator that compares detected amplitude values on the normal phase side and the reversed phase side; and
a controller that generates the select signal based on a result of the comparison.

* * * * *